United States Patent [19]

Honda et al.

[11] Patent Number: 5,786,716
[45] Date of Patent: Jul. 28, 1998

[54] SIGNAL GENERATOR FOR GENERATING TEST MODE SIGNALS

[75] Inventors: Takashi Honda; Shinya Takahashi, both of Tokyo, Japan

[73] Assignee: Oki Electric Industry Co., Ltd., Tokyo, Japan

[21] Appl. No.: 788,121

[22] Filed: Jan. 23, 1997

[30] Foreign Application Priority Data

Jan. 30, 1996 [JP] Japan .................... 8-014232

[51] Int. Cl.$^6$ .................... G05F 3/16; H03L 1/00
[52] U.S. Cl. .................... 327/143; 327/142; 327/198; 327/530
[58] Field of Search .................... 327/143, 142, 327/198, 530, 77, 205, 206

[56] References Cited

U.S. PATENT DOCUMENTS 5,327,072  7/1994  Savignac et al. .................... 327/530

FOREIGN PATENT DOCUMENTS 0 238 283  9/1987  European Pat. Off. .
0 255 362  2/1988  European Pat. Off. .
0 399 207  11/1990  European Pat. Off. .

Primary Examiner—Timothy P. Callahan
Assistant Examiner—Dinh T. Le
Attorney, Agent, or Firm—Spencer & Frank

[57] ABSTRACT

A signal generator for generating test mode signals when any voltage higher than a recommended input high voltage is applied to a predetermined input pin, and for switching from a normal mode to a test mode in response to the test mode signals. A high impedance circuit is coupled between the input pin and a first node. The high impedance circuit comprises a plurality of transistors, the plurality of transistors respectively being connected in series and respectively having a gate coupled with a source or a drain. A signal amplifier is coupled with the high impedance circuit through the first node. A resistor is coupled between the first node and a reference voltage. A transistor is coupled between the first node and a second node between predetermined transistors among the plurality of transistors. The transistor bypasses a current path from the second node to the first node and maintains a potential level of the first node, in response to an output condition of the signal amplifier.

15 Claims, 3 Drawing Sheets 5,786,716

SIGNAL GENERATOR FOR GENERATING TEST MODE SIGNALS

This application Ser. No. 014232/1996, filed Jan. 30, 1996 in Japan, the subject matter of which is incorporated herein by reference.

BACKGROUND OF THE INVENTION

1. Field of the invention

The present invention relates to a signal generator for generating test mode signals when any voltage higher than a recommended input high voltage is applied to a predetermined input pin and for switching from a normal mode to a test mode in response to the test mode signals.

2. Description of the related art

A conventional method of testing or checking operating conditions of Dynamic Random Access Memories (DRAMs) uses a signal generator for generating test mode signals when any voltage higher than a recommended input high voltage is applied to a predetermined input pin and for switching from a normal mode to a test mode in response to the test mode signals.

The signal generator comprises an input pin, a high impedance circuit connected to the input pin, a signal amplifier connected to the high impedance circuit, and a resistor connected between the high impedance circuit and Vss.

The signal generator generates test mode signals when a potential (12 V) higher than a recommended input high voltage is applied to a predetermined input pin at power up and the DRAMs are tested using the test mode signals.

SUMMARY OF THE INVENTION

An object of the present invention is to provide a signal generator that is able to switch from a normal mode to a test mode at a low voltage.

According to one aspect of the present invention, or achieving the above object, there is provided a signal generator comprising an input pin, a circuit being coupled between the input pin and a first node, the circuit comprising a plurality of transistors, the plurality of transistors respectively being connected in series and respectively having a gate coupled with a source or a drain, a signal amplifier being coupled with the circuit through the first node, a resistor being coupled between the first node and a reference voltage, and a transistor being coupled between the first node and a second node between predetermined transistors among the plurality of transistors, the transistor bypassing a current path from the second node to the first node and maintaining a potential level of the first node, in response to an output condition of the signal amplifier.

According to another aspect of the present invention, for achieving the above object, there is provided a signal generator comprising an input pin, a circuit being coupled between the input pin and a first node, the circuit comprising a plurality of transistors, the plurality of transistors respectively being connected in series and respectively having a gate coupled with a source or a drain, a signal amplifier being coupled with the circuit through the first node, a resistor being coupled between the first node and a reference voltage, a first transistor being coupled between the first node and a second node between first predetermined transistors among the plurality of transistors, the first transistor bypassing a current path from the second node to the first node and supplying a predetermined potential to the first node, in response to a input of a control signal and an output condition of the signal amplifier, and a second transistor being coupled between the first node and a third node between second predetermined transistors among the plurality of transistors, the second transistor bypassing a current path from the third node to the first node and maintaining the predetermined potential of the first node, in response to the output condition of the signal amplifier.

According to another aspect of the present invention, for achieving the above object, there is provided a signal generator comprising an input pin, a circuit being coupled between the input pin and a first node, the circuit comprising a plurality of transistors, the plurality of transistors respectively being connected in series and respectively having a gate coupled with a source or a drain, a signal amplifier being coupled with the circuit through the first node, a resistor being coupled between the first node and a reference voltage, a first transistor being coupled between the first node and a second node between a predetermined transistors among the plurality of transistors, the first transistor bypassing a current path from the second node to the first node and supplying a predetermined potential to the first node, in response to a input of a control signal and an output condition of the signal amplifier, and a second transistor being coupled between the first node and the second node, the second transistor bypassing a current path from the second node to the first node and maintaining the predetermined potential of the first node, in response to the output condition of the signal amplifier.

According to another aspect of the present invention, for achieving the above object there is provided a signal generator, wherein the signal amplifier comprises a plurality of inverter circuits, an inverter of a first stage toward an input side of the plurality of inverter circuits setting up a threshold voltage lower than that of the other inverter.

According to another aspect of the present invention, for achieving the above object there is provided a signal generator, wherein the inverter circuit of the first stage comprises a p-MOS transistor and an n-MOS transistor, a gate width of the p-MOS transistor being shorter than a gate width of the n-MOS transistor.

According to another aspect of the present invention, for achieving the above object there is provided a signal generator, wherein the inverter circuit of the first stage comprises a p-MOS transistor and an n-MOS transistor, a gate length of the p-MOS transistor being longer than a gate length of the n-MOS transistor.

BRIEF DESCRIPTION OF THE DRAWINGS

While the specification concludes with claims particularly pointing out and distinctly claiming the subject matter that is regarded as the invention, it is believed that the invention, and the objects, features and advantages thereof will be better understood from the following description taken in connection with the accompanying drawings in which:

DETAILED DESCRIPTION OF THE PREFERRED EMBODIMENTS (A) A First Embodiment of the Signal Generator A signal generator according to a first embodiment of the present invention will hereinafter be described with reference to the accompanying drawings.

Figure 1:
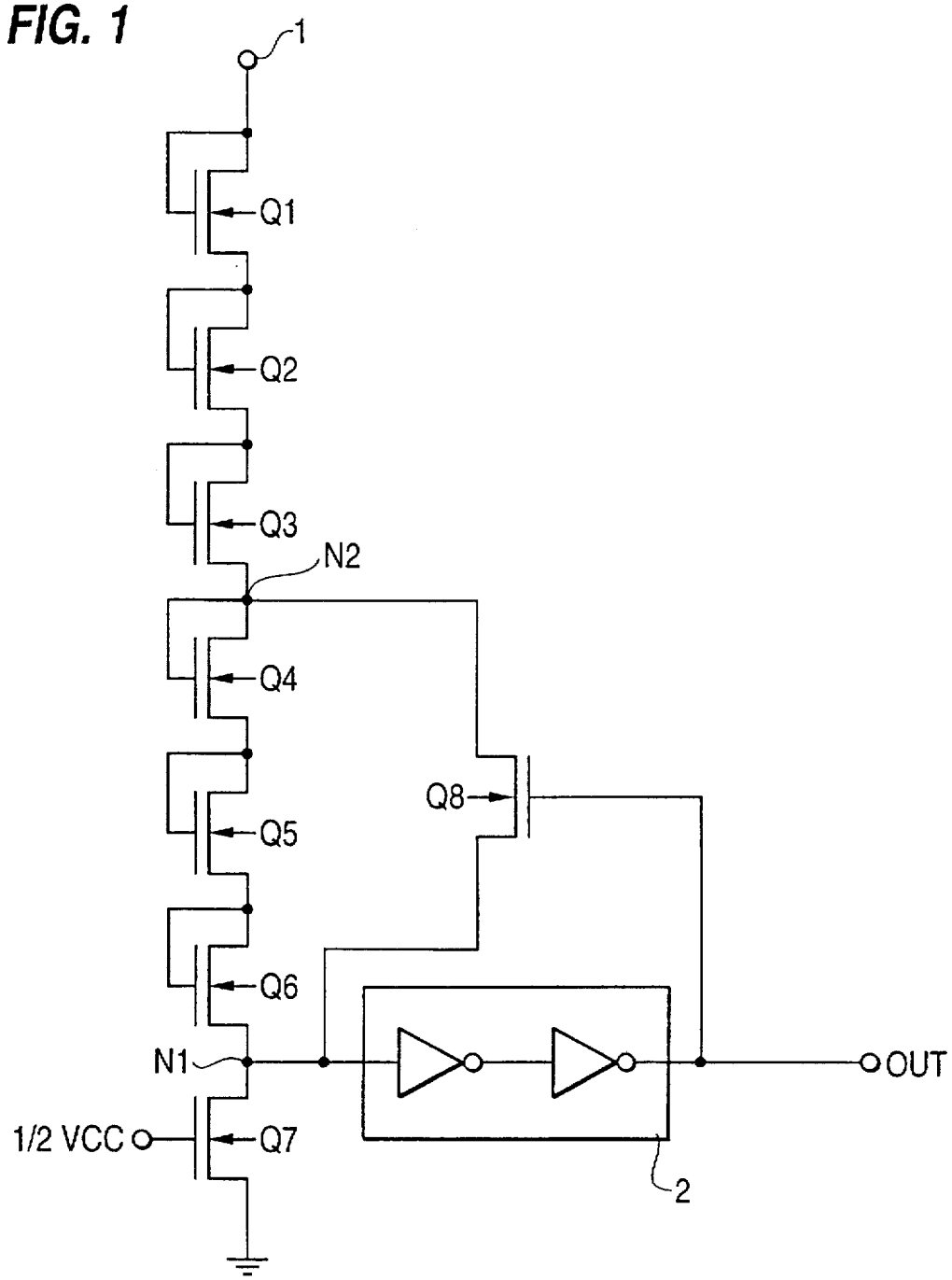
FIG. 1 is a circuit diagram of a signal generator showing a first embodiment of the present invention.

FIG. 1 is a circuit diagram of a signal generator showing a first embodiment of the present invention.

The signal generator shown in FIG. 1 comprises: an input pin 1; a high impedance circuit being coupled with the input pin 1, the high impedance circuit comprising a plurality of n-MOS transistors (Q1~Q6), the plurality of n-MOS transistors (Q1~Q6) respectively being connected in series and respectively having a gate coupled with a source or a drain; a signal amplifier 2 comprising a plurality of inverter circuits being coupled with an n-MOS transistor Q6 toward an output side the plurality of n-MOS transistors (Q1~Q6), having an output terminal for outputting a test mode signal, and being coupled with the high impedance circuit through a first node N1; a resistor being coupled between an n-MOS transistor Q6 and reference voltage(for example Vss) through the first node N1; an n-MOS transistor Q7 constantly applying ½ Vcc to a gate of the n-MOS transistor Q7, and an n-MOS transistor Q8 being coupled between the first node N1 and a second node N2 between predetermined transistors among the plurality of n-MOS transistors (Q1~Q6), with a gate of the n-MOS transistor Q8 being coupled with an output terminal of the signal amplifier 2.

Furthermore, the n-MOS transistor Q8 bypasses a current path from the second node N2 to the first node N1 and maintains a potential level of the first node N1, according to an output condition of the signal amplifier 2.

Furthermore, since the n-MOS transistor Q7 acting as a resistor constantly applies ½ Vcc to a gate of the n-MOS transistor Q7, a potential of the node between the input pin 1 and a drain of the n-MOS transistor Q1 correlates with a potential of the first node N1.

An Operation of the Signal Generator of the First Embodiment

Figure 2:
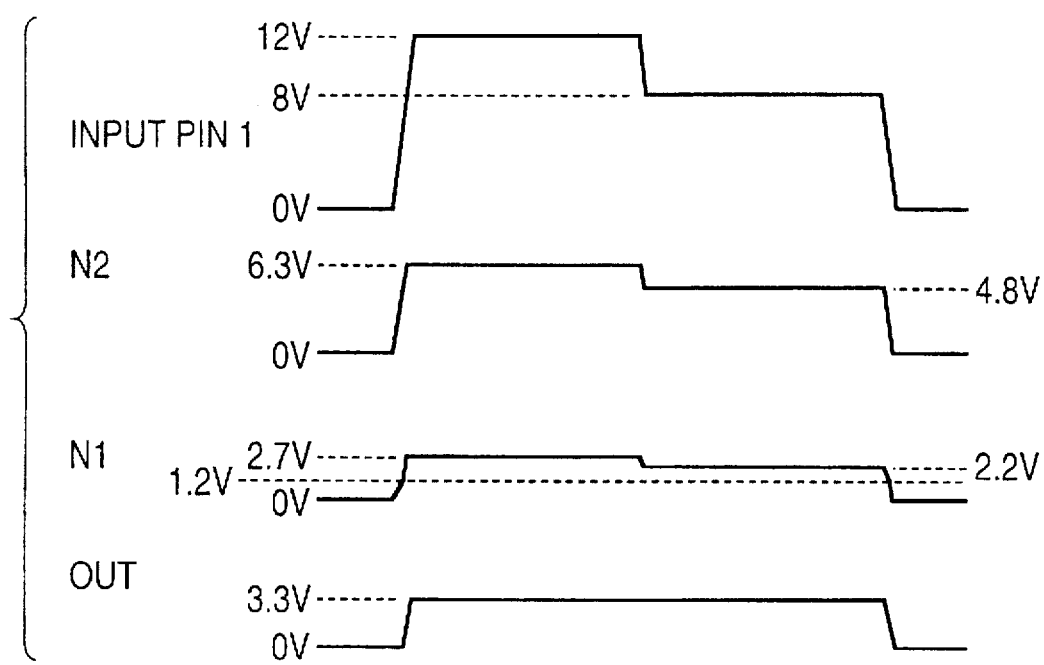
FIG. 2 is a timing chart for describing the operation of the signal generator shown in FIG. 1.

The operation of the signal generator of the first embodiment constructed as described above will now be described with reference to the circuit diagram shown in FIG. 1 and a timing chart shown in FIG. 2.

The signal generator showing the first embodiment of the present invention is put in an enabled state when a potential 12 V higher than a recommended input high voltage (for example 6.5 V) is applied to a predetermined input pin 1.

First, when 12 V higher than a recommended input high voltage (6.5 V), is applied to the input pin 1, a plurality of n-MOS transistors (Q1~Q6)(a high impedance circuit) are successively turned on. Thereafter, a potential level of a first node N1 is in an H level state.

Then, when the potential level of the first node N1 is in the H level state and the potential of the first node N1 rises to a potential (for example 1.2 V) higher than a threshold voltage of the signal amplifier 2, the signal amplifier 2 amplifies the potential of the first node N1 and the output terminal rises to 3.3 V.

Then, the H level signal is outputted from the output terminal in response to an operation as described above. Thereafter, the H level signal is used as a test mode signal.

Then, the n-MOS transistors Q8 turns on in response to the H level of the output terminal. A current path between the first node N1 and the second node N2 is bypassed in response to which the n-MOS transistors Q8 turns on. Therefore, the current path between the first node N1 and the second node N2 is put in a conductive state.

Since the current path between the first node N1 and the second node N2 is put in a conductive state, a voltage that must be applied to the input pin 1 in order to maintain an output of a test mode signal from the output terminal of the signal amplifier 2 can have a value lower than 12 V. Therefore, the lower voltage has a value sufficient to maintain the n-MOS transistors (Q1~Q3) in an on state and to maintain a potential at the first node N1 higher than a threshold voltage of the signal amplifier 2. For example, the lower voltage is 8 V in the first embodiment of the present invention.

Then, when a voltage applied to the input pin 1 becomes less than 6.5 V, the n-MOS transistors (Q1~Q3) are in an off state. In response to the off state, the signal amplifier 2 also enters an off state. Further, the n-MOS transistor Q7 completely sets the first node N1 in an L level state. Therefore, the output of the test mode signal stops in response to an operation as described above and a test mode switches to a normal mode.

As described above, the signal generator of the first embodiment shown in FIG. 1 needs to apply an input voltage (for example, 12 V) higher than a recommended input high voltage to the input pin 1 until the n-MOS transistor Q8 enters an on state. However once the n-MOS transistor Q8 enters an on state, an output of a test mode signal can be maintained even if a input voltage (for example, 8 V) is less than a recommended input high voltage. Therefore, the signal generator of the first embodiment doesn't need to continue applying an input voltage higher than a recommended input high voltage to the input pin 1. Thus, since the signal generator of the first embodiment does not need to continue applying an input voltage higher than a recommended input high voltage to the input pin 1, gate oxide breakdown of a transistor can be prevented from occurring when a test mode signal is outputted.

Furthermore, the signal amplifier 2 is comprised of a plurality of inverter which are formed of the n-MOS transistor and the p-MOS transistor. Since a first stage inverter of an input side of the signal amplifier 2 has a threshold voltage lower than other inverter of the signal amplifier 2, the signal generator of the first embodiment is more sensitive to a change of a potential at the node N1.

Therefore, the p-MOS transistor constructing the first stage inverter has a lower driving ability than the n-MOS transistor. Specifically, a gate width of the p-MOS transistor is shorter than a gate width of the n-MOS transistor, or a gate length of the p-MOS transistor is longer than a gate length of the n-MOS transistor. Therefore, it is possible to secure low voltage applied to the input pin 1, and to prevent a leakage current from she input pin 1 to Vss.

(B) A Second Embodiment of a Signal Generator

A signal generator according to a second embodiments of the present invention will hereinafter be described with reference to the accompanying drawings.

Figure 3:
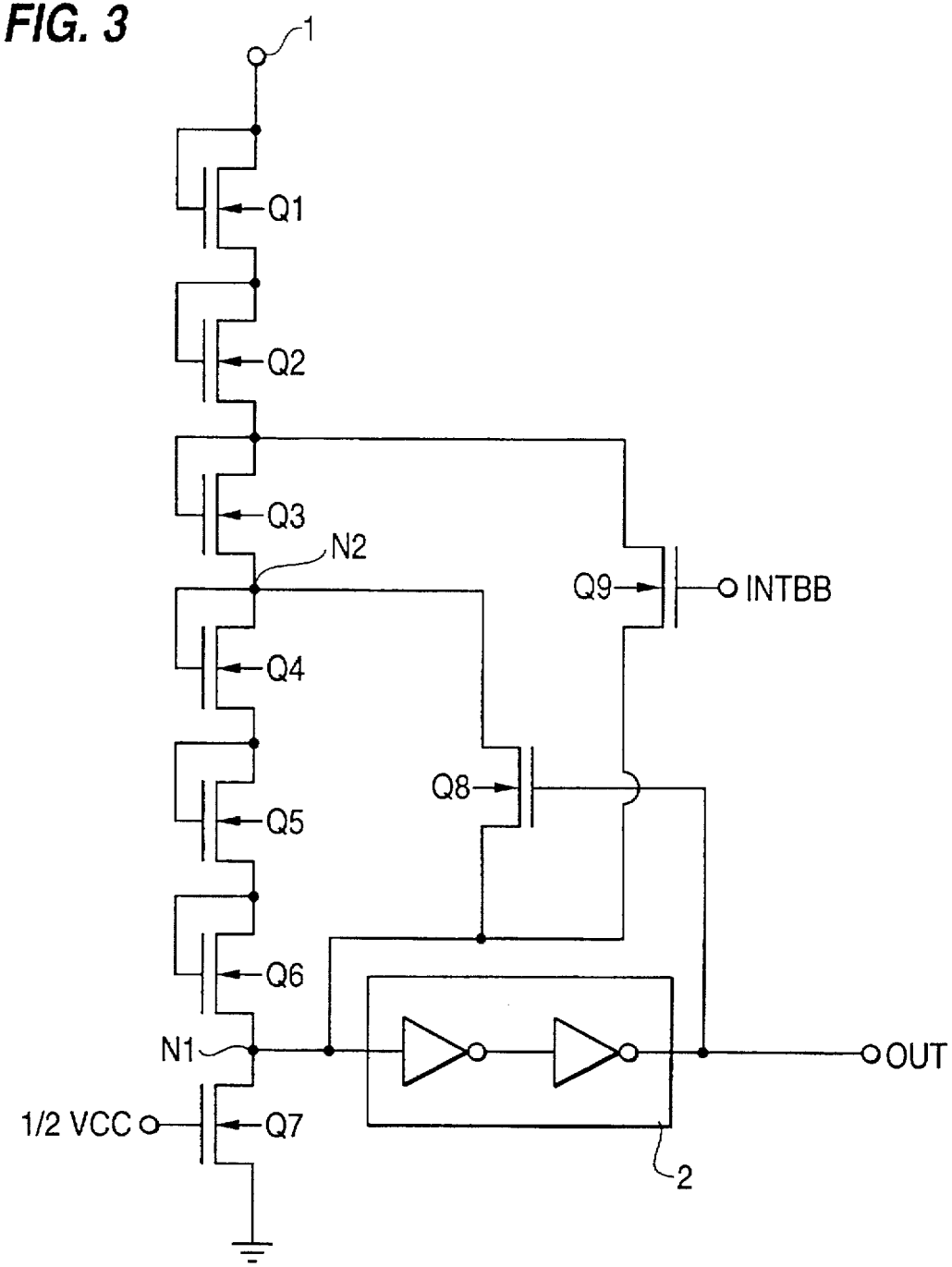
FIG. 3 is a circuit diagram of a signal generator illustrating a second embodiment of the present invention.

FIG. 3 is a circuit diagram of a signal generator showing a second embodiment of the present invention.

The signal generator shown in FIG. 3 comprises: an input pin 1; a high impedance circuit being coupled with the input pin 1, the high impedance circuit comprising a plurality of n-MOS transistors (Q1~Q6), the plurality of n-MOS transistors (Q1~Q6) respectively being connected in series and respectively having a gate coupled with a source or a drain; a signal amplifier 2 comprising a plurality of inverter circuits being coupled with an n-MOS transistor Q6 toward an output side of the plurality of n-MOS transistors (Q1~Q6), having an output terminal for outputting a test mode signal, and being coupled with the high impedance circuit through a first node N1; a resistor being coupled between an n-MOS transistor Q6 and reference voltage (for example Vss) through the first node N1; an n-MOS transistor Q7 constantly applying ½ Vcc to a gate of the n-MOS transistor Q7; an n-MOS transistor Q8 being coupled between the first node N1 and a second node N2 between predetermined transistors among the plurality of n-MOS transistors (Q1~Q6), a gate of the n-MOS transistor Q8 being coupled with an output terminal of the signal amplifier 2; and an n-MOS transistor Q9 being coupled between the first node N1 and a third node N3 between predetermined transistors in the plurality of n-MOS transistors (Q1~Q6), a gate of the n-MOS transistor Q9 being coupled with a control signal INTBB.

Furthermore, the n-MOS transistor Q8 bypasses a current path from the second node N2 to the first node N1 and maintains a potential level of the first node N1, in response to an output condition of the signal amplifier 2.

Furthermore, the n-MOS transistor Q9 bypasses a current path from the third node N3 to the first node N1 and supplies a predetermined potential to the first node N1, in response to an input of a control signal INTBB, and a situation where any voltage higher than a recommended input high voltage is applied to a predetermined input pin 1.

Furthermore, since the n-MOS transistor Q7 acting as a resistor constantly applies ½ Vcc to a gate of the n-MOS transistor Q7, a potential of the node between the input pin 1 and a drain of the n-MOS transistor Q1 correlates with a potential of the first node N1.

An Operation of the Signal Generator of the Second Embodiment

Figure 4:
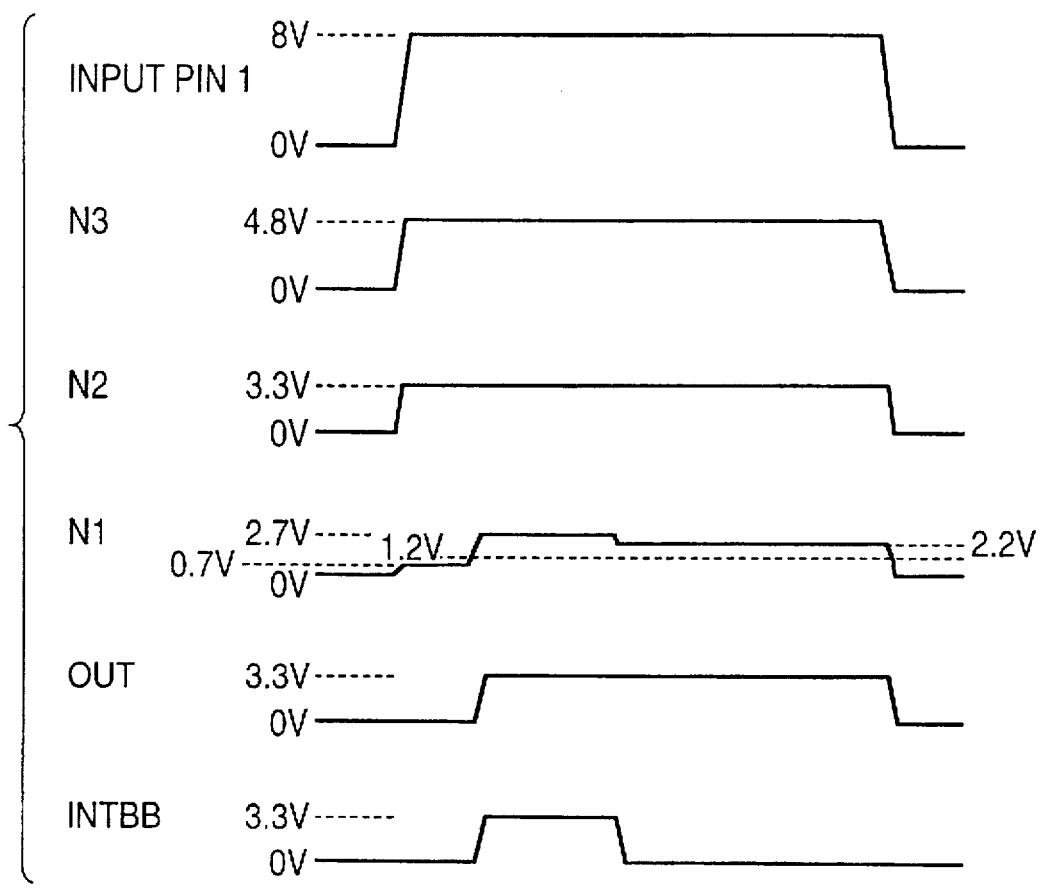
FIG. 4 is a timing chart for describing the operation of the signal generator shown in FIG. 3.

The operation of the signal generator of the second embodiment constructed as described above will now be described with reference to the circuit diagram shown in FIG. 3 and a timing chart shown in FIG. 4.

The signal generator showing the second embodiment of the present invention is put in an enabled state when 12 V higher than a recommended input high voltage (for example 6.5 V) is applied to a predetermined input pin 1.

First, when a voltage (for example 8 V) higher than a recommend input high voltage (for example 6.5 V) is applied to the input pin 1, n-MOS transistors Q1 and Q2 are successively turned on. In a situation where a control signal INTBB (for example 3.3 V) is inputted to a gate of n-MOS Transistor Q9, a current path between a third node N3 and a first node N1 is in a conductive state. Therefore, a potential level of a first node N1 is in an H level state.

Then, when the potential level of the first node N1 is in the H level state and the potential of the first node N1 rises to a potential (for example 1.2 V) higher than a threshold voltage of the signal amplifier 2, the signal amplifier 2 amplifies the potential of the first node N1 and the output terminal rises to 3.3 V.

Then, the H level signal is outputted from the output terminal in response to an operation as described above, the H level signal is thereafter used as a test mode signal.

Then, the n-MOS transistors Q8 turns on in response to the H level of the output terminal. A current path between the first node N1 and the second node N2 is bypassed in response to which the n-MOS transistors Q8 turns on. Therefore, the current path between the first node N1 and the second node N2 will become conductive.

Since the current path between the first node N1 and the second node N2 becomes conductive, a voltage which must be applied to the input pin 1 to maintain an output of a test mode signal from the output terminal of the signal amplifier 2 can have a value lower than 12 V. Therefore, the lower voltage has a value sufficient to maintain an on state of the n-MOS transistors (Q1~Q3) and to maintain a potential higher than a threshold voltage of the signal amplifier 2 at the first node N1. For example, the lower voltage is 8 V in the second embodiment of the present invention.

Then, when a voltage applied to the input pin 1 becomes than 6.5 V, the potential of the first node N1 falls and the signal amplifier 2 is also in an off state. In response to the off state, a potential of the output terminal also falls and the n-MOS transistor Q8 is in an off state. Further, the n-MOS transistor Q7 completely sets the first node N1 to an L level state. Therefore, the output of the test mode signal stops in response to an operation as described above and a test mode switches to a normal mode.

Further, even if the n-MOS transistor Q9 is in an off state in response to which the control signal INTBB becomes an L level, an activated state of the signal amplifier 2 is maintained if only the n-MOS transistor Q8 is in an on state. Thus, the control signal INTBB is maintained at an H level until the n-MOS transistor Q8 is in an on state.

As described above, the lower voltage applied to the input pin 1 is preferably sufficient to put at least the n-MOS transistors Q1 and Q2 in an on state and to maintain a potential higher than a threshold value of the signal amplifier 2 at the first node N1, until the test mode signal is outputted from the output terminal OUT. For example, the lower voltage is 8 V.

Then, if the n-MOS transistor Q8 is put an on state, a voltage sufficient to put the n-MOS transistors Q1, Q2, Q3 is in an on state is preferably applied to the input pin 1, for example, 8 V.

The second embodiment of the present invention does not need to apply an input voltage (for example, 12 V) higher than a recommended input high voltage to the input pin 1.

Thus, since the second embodiment of the present invention is able to provide a signal generator that switches from a normal mode to a test mode at a lower voltage than in the conventional art, gate oxidation layer breakdown of a transistor can be prevented from occurring when a test mode signal is outputted.

Furthermore, since a first stage inverter of an input side of the signal amplifier 2 has a threshold voltage lower than other inverter of the signal amplifier 2, the signal generator of the second embodiment is more sensitive to a change of a potential at the node N1. Therefore, the p-MOS transistor constructing the first stage inverter has a driving ability lower than the n-MOS transistor. Specifically, a gate width of the p-MOS transistor is shorter than a gate width of the n-MOS transistor, or a gate length of the p-MOS transistor is longer than a gate length of the n-MOS transistor. Therefore, it is possible to secure a low voltage applied to the input pin 1, and to prevent a leakage current from the input pin 1 to Vss.

A signal generator of an another embodiment comprising: an input pin; a circuit being coupled between the input pin and a first node, the circuit comprising a plurality of transistors, the plurality of transistors respectively being connected in series and respectively having a gate coupled with a source or a drain; a signal amplifier being coupled with the circuit through the first node; a resistor being coupled between the first node and a reference voltage; a first transistor being coupled between the first node and a second node between a predetermined transistors among the plurality of transistors, the first transistor bypassing a current path from the second node to the first node and supplying a predetermined potential to the first node, in response to an input of a control signal and an output condition of the signal amplifier; and a second transistor being coupled between the first node and the second node, the second transistor bypassing a current path from the second node to the first node and maintaining the predetermined potential of the first node, in response to the output condition of the signal amplifier.

The preferred embodiments have been described above in detail. However, the signal generator of the present invention is not necessarily limited to the configurations of the two embodiments referred to above. Various changes can be made thereto.

The n-MOS transistors (Q1–Q6) shown in FIG. 1, 3 may have the source connected to the gate, respectively, for example.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A signal generator comprising:
   an input pin;
   a circuit being coupled between the input pin and a first node, the circuit comprising a plurality of transistors, the plurality of transistors respectively being connected in series and respectively having a gate coupled with a source or a drain;
   a signal amplifier being coupled with the circuit through the first node;
   a resistor being coupled between the first node and a reference voltage; and
   a transistor being coupled between the first node and a second node between predetermined transistors among the plurality of transistors, the transistor bypassing a current path from the second node to the first node and maintaining a potential level of the first node, in response to an output condition of the signal amplifier.

2. The signal generator according to claim 1, wherein in the circuit comprising a high impedance circuit, the high impedance circuit turns on when any voltage higher than a predetermined input high voltage is applied to the input pin.

3. The signal generator according to claim 1, wherein the signal amplifier comprises a plurality of inverter circuits, an inverter circuit of a first stage toward an input side of the plurality of inverter circuits setting up a threshold voltage lower than other inverters.

4. The signal generator according to claim 3, wherein the inverter circuit of the first stage comprises a p-MOS transistor and an n-MOS transistor, and a gate width of the p-MOS transistor is shorter than a gate width of the n-MOS transistor.

5. The signal generator according to claim 4, wherein the inverter circuit of the first stage comprises a p-MOS transistor and an n-MOS transistor, and a gate length of the p-MOS transistor is longer than a gate length of the n-MOS transistor.

6. A signal generator comprising:
   an input pin;
   a circuit being coupled between the input pin and a first node, the circuit comprising a plurality of transistors, the plurality of transistors respectively being connected in series and respectively having a gate coupled with a source or a drain;
   a signal amplifier being coupled with the circuit through the first node;
   a register being coupled between the first node and a reference voltage;
   a first transistor being coupled between the first node and a second node between predetermined transistors among the plurality of transistors, the first transistor bypassing a current path from the second node to the first node and supplying a predetermined potential to the first node, in response to an input of a control signal and an output condition of the signal amplifier; and
   a second transistor being coupled between the first node and third node between second predetermined transistors among the plurality of transistors, the second transistor bypassing a current path from the third node to the first node and maintaining the predetermined potential of the first node, in response to the output condition of the signal amplifier.

7. The signal generator comprising:
   an input pin;
   a circuit being coupled between the input pin and a first node, the circuit comprising a plurality of transistors, the plurality of transistors respectively being connected in series and respectively having a gate coupled with a source or a drain;
   a signal amplifier being coupled with the circuit through the first node;
   a resistor being coupled between the first node and a reference voltage;
   a first transistor being coupled between the first node and a second node between a predetermined transistors among the plurality of transistors, the first transistors bypassing a current path from the second node to the first node and supplying a predetermined potential to the first node, in response to an input of a control signal and an output condition of the signal amplifier; and
   a second transistor being coupled between the first node and the second node, the second transistor bypassing a current path from the second node to the first node and maintaining the predetermined potential of the first node, in response to the output condition of the signal amplifier.

8. The signal generator according to claim 6, wherein the circuit comprising a high impedance circuit, the high impedance circuit turns on when any voltage higher than a recommended input high voltage is applied to the input pin.

9. The signal generator according to claim 6, wherein the signal amplifier comprises a plurality of inverter circuits, an inverter of a first stage toward an input side of the plurality of inverter circuits setting up a threshold voltage lower than other inverters.

10. The signal generator according to claim 9, wherein the inverter circuit of the first stage comprises a p-MOS transistor and an n-MOS transistor, a gate line width of the p-MOS transistor being shorter than a gate line width of the n-MOS transistor.

11. The signal generator according to claim 10, wherein the inverter circuit of the first stage comprises a p-MOS transistor and an n-MOS transistor, a gate line length of the p-MOS transistor being longer than a gate line length of the n-MOS transistor.

12. The signal generator according to claim 7, wherein in the circuit comprising a high impedance circuit, the high impedance circuit turns on when any voltage higher than a predetermined input high voltage is applied to the input pin.

13. The signal generator according to claim 7, wherein the signal amplifier comprises a plurality of inverter circuits, an inverter of a first stage toward an input side of the plurality of inverter circuits setting up a threshold voltage lower than other inverter.

14. The signal generator according to claim 12, wherein the inverter circuit of the first stage comprises a p-MOS transistor and a n-MOS transistor, a gate width of the p-MOS transistor being shorter than a gate width of the n-MOS transistor.

15. A signal generator according to claim 14, wherein the inverter circuit of the first stage comprises a p-MOS transistor and a n-MOS transistor, a gate length of the p-MOS transistor being longer than a gate length of the n-MOS transistor.

* * * * *